US010520334B2

(12) United States Patent
Creech et al.

(10) Patent No.: US 10,520,334 B2
(45) Date of Patent: Dec. 31, 2019

(54) INDUCTION BASED POSITION SENSING IN AN ELECTROMAGNETIC ACTUATOR

(71) Applicant: DANA AUTOMOTIVE SYSTEMS GROUP, LLC, Maumee, OH (US)

(72) Inventors: Michael Z. Creech, Ann Arbor, MI (US); Justin S. Davis, Maumee, OH (US)

(73) Assignee: Dana Automotive Systems Group, LLC, Maumee, OH (US)

( * ) Notice: Subject to any disclaimer, the term of this patent is extended or adjusted under 35 U.S.C. 154(b) by 134 days.

(21) Appl. No.: 15/559,441

(22) PCT Filed: Mar. 18, 2016

(86) PCT No.: PCT/US2016/023050
§ 371 (c)(1),
(2) Date: Sep. 19, 2017

(87) PCT Pub. No.: WO2016/153972
PCT Pub. Date: Sep. 29, 2016

(65) Prior Publication Data
US 2018/0080799 A1 Mar. 22, 2018

Related U.S. Application Data

(60) Provisional application No. 62/136,213, filed on Mar. 20, 2015.

(51) Int. Cl.
G01D 5/20 (2006.01)
G01R 33/00 (2006.01)
(Continued)

(52) U.S. Cl.
CPC ............. *G01D 5/2013* (2013.01); *G01K 7/18* (2013.01); *G01R 33/0082* (2013.01);
(Continued)

(58) Field of Classification Search
CPC .... G01D 5/2013; G01K 7/18; G01K 2217/00; G01R 33/0082; H01F 7/1844; H01F 2007/185
See application file for complete search history.

(56) References Cited

U.S. PATENT DOCUMENTS 4,870,364 A  9/1989 Trox et al.
5,427,352 A * 6/1995 Brehm ................ F15B 13/0405
                                                251/64
(Continued)

FOREIGN PATENT DOCUMENTS

DE      4318263 A1    1/1995
WO      WO/02076615 A2  10/2002

OTHER PUBLICATIONS

European Patent Office, The International Search Report with Written Opinion, dated Jun. 7, 2016, 12 pages, European Patent Office, Rijswijk, Netherlands.

*Primary Examiner* — David M. Gray
*Assistant Examiner* — Michael A Harrison
(74) *Attorney, Agent, or Firm* — Marshall & Melhorn, LLC

(57) ABSTRACT

The present invention relates to a method and system for determining the position of the armature of a solenoid using a controller to determine the temperature of the solenoid and to indirectly determine the position of the armature without the need of an additional sensor using current sensing pulses and a solenoid capable of staying engaged due to residual magnetism after the coil has been de-energized.

12 Claims, 3 Drawing Sheets

(51) Int. Cl.
*G01K 7/18* (2006.01)
*H01F 7/18* (2006.01)

(52) U.S. Cl.
CPC ....... *H01F 7/1844* (2013.01); *G01K 2217/00* (2013.01); *H01F 2007/185* (2013.01)

(56) References Cited

U.S. PATENT DOCUMENTS

| | | | |
|---|---|---|---|
| 5,942,892 A * | 8/1999 | Li | H01F 7/1844 |
| | | | 137/554 |
| 6,560,088 B1 | 5/2003 | Beck et al. | |
| 6,669,909 B2 | 12/2003 | Shvets et al. | |
| 6,722,628 B1 | 4/2004 | Seil | |
| 6,892,265 B2 | 5/2005 | Sagues et al. | |
| 6,895,997 B2 | 5/2005 | Qu et al. | |
| 7,216,191 B2 | 5/2007 | Sagues et al. | |
| 7,511,478 B2 | 3/2009 | Ganev | |
| 7,768,257 B2 | 8/2010 | Lueck | |
| 7,882,896 B2 | 2/2011 | Wilson et al. | |
| 8,027,572 B2 | 9/2011 | Bedingfield et al. | |
| 8,160,433 B2 | 4/2012 | Bedingfield et al. | |
| 8,183,719 B2 | 5/2012 | Scripca et al. | |
| 8,403,124 B2 | 3/2013 | Dimig et al. | |
| 8,644,692 B2 | 2/2014 | Bedingfield et al. | |
| 8,710,828 B1 | 4/2014 | Meisel | |
| 8,862,452 B2 | 10/2014 | Sagues | |
| 9,013,854 B2 | 4/2015 | Sagues et al. | |
| 9,153,970 B2 | 10/2015 | Scripca et al. | |
| 9,337,766 B2 | 5/2016 | Weinl et al. | |
| 2006/0250123 A1* | 11/2006 | Hein | B41M 5/5218 |
| | | | 324/71.1 |
| 2013/0201591 A1 | 8/2013 | Dimig et al. | |
| 2015/0248509 A1 | 9/2015 | Sagues et al. | |
| 2016/0078990 A1 | 3/2016 | Sagues et al. | |

* cited by examiner

INDUCTION BASED POSITION SENSING IN AN ELECTROMAGNETIC ACTUATOR

CROSS-REFERENCE TO RELATED APPLICATIONS

This application claims the benefit of U.S. Provisional Application No. 62/136,213 filed on Mar. 20, 2015, which is herein incorporated by reference in its entirety.

FIELD OF THE INVENTION

The present invention relates to a method and system for determining the position of an armature of a solenoid. Specifically, using a controller to determine the temperature of the solenoid and indirectly determine the position of the armature without the need of an additional sensor.

BACKGROUND OF THE INVENTION

Solenoids are well-known and are used to perform a wide range of functions including latching, braking, switching, clamping, connecting, etc. In the automotive industry specifically solenoids are used to actuate various mechanisms including locking mechanism, valves, etc.

When current is supplied to a solenoid, the solenoid transduces the flow to a magnetic force that can cause mechanical displacement of a movable part of the solenoid, i.e. the armature/plunger. Generally, in order to maintain the displacement of the armature, the solenoid has to be continuously energized. It has been previously discovered that by selecting the correct materials from which to manufacture the parts of the solenoid, one can take advantage of residual magnetism in the solenoid parts after energization of the solenoid to hold the armature in an engaged position without having to continuously energize the solenoid. In other words, when the coil of the solenoid is de-energized, the residual magnetism in the solenoid parts alone is sufficient to maintain the armature in an engaged position.

It is often desirable or necessary to determine the position of a mechanism that is operated by a solenoid or the location of a solenoid armature itself. The prior art includes many systems to determine the position of a solenoid. Typically these systems use some form of position feedback using a variety of sensors that verify the mechanism has achieved the desired mechanical state after the solenoid has been energized. These systems can include multiple sensors, wiring for the sensors and connectors adding significant cost and additional failure modes that need to be avoided.

In addition, other previous attempts to sense the position of an armature have required an interruption in power to vary the current levels to enable the system to monitor a change in current and correlate that change to a change in position of the armature. In these systems the solenoid materials are already highly saturated magnetically by the energized solenoid and, therefore, the variation in current rise times at these high current levels is not large and difficult to detect.

In view of the disadvantages associated with the prior art systems, it would be advantageous for a system to avoid additional sensors, wiring and connectors to lower the cost of the system and remove possible system failure modes.

SUMMARY OF THE INVENTION

The present invention relates to a method and system for sensing the position of an armature including a solenoid and a controller where the solenoid includes a coil, a housing and an armature. The controller applies a current to the coil to move the armature. The current is terminated and the controller utilizes a resistance-sensing voltage pulse to determine the temperature of the coil by measuring the current to calculate resistance. The controller utilizes an inductance-sensing voltage pulse to indirectly determine the position of the armature position by measuring current to calculate inductance.

This inductance based position sensing has the potential to be used in many applications that do not require fail-safe-open type solenoids.

BRIEF DESCRIPTION OF THE DRAWINGS

The above, as well as other advantages of the present invention, will become readily apparent to those skilled in the art from the following detailed description when considered in the light of the accompanying drawings in which.

DETAILED DESCRIPTION

It is to be understood that the invention may assume various alternative orientations and step sequences, except where expressly specified to the contrary. It is also to be understood that the specific devices and processes illustrated in the attached drawings, and described in the following specification are simply exemplary embodiments of the inventive concepts defined herein. Hence, specific dimensions, directions or other physical characteristics relating to the embodiments disclosed are not to be considered as limiting, unless expressly stated otherwise.

Figure 1:
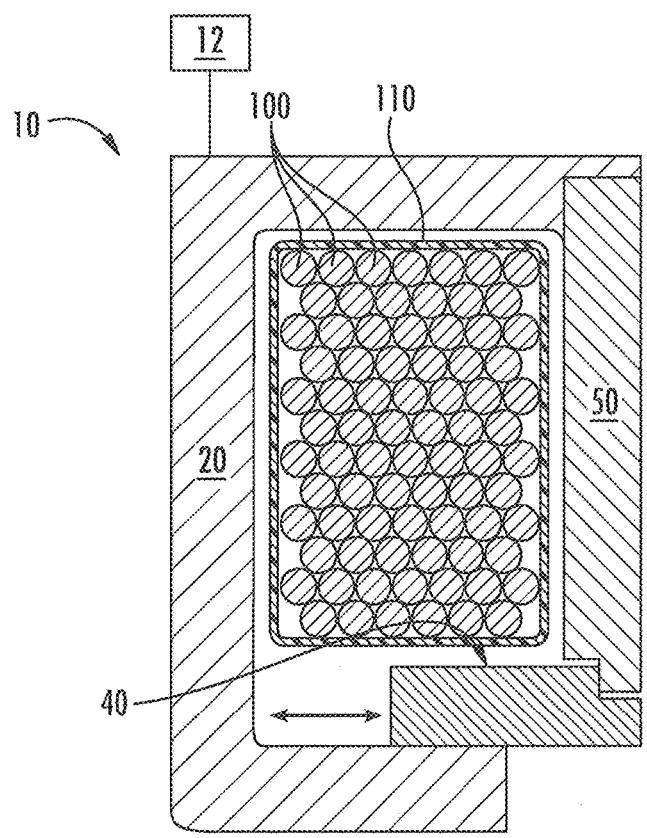
FIG. 1 shows a schematic cross-sectional view of a preferred embodiment of a solenoid with the armature in the engaged position.
Figure 2:
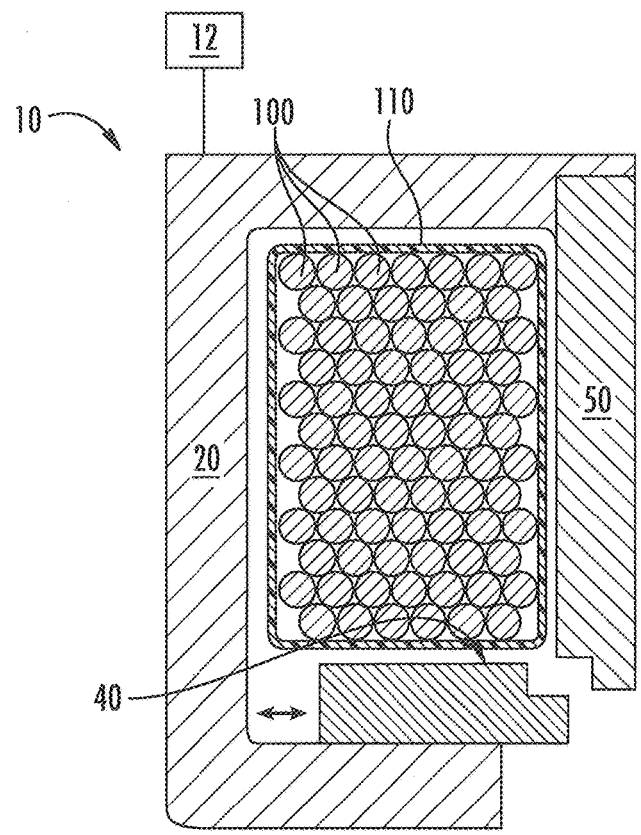
FIG. 2 shows a schematic cross-sectional view of a preferred embodiment of the solenoid with the armature in the disengaged position.

Referring now to FIG. 1, a preferred embodiment of a solenoid 10 having a coil 100 encased in a potting or overmold 110 is shown. Coil 100 may include wire windings made of any type of metallic conductor including copper, aluminum, steel, nickel, iron or any other suitable metallic or metallic-alloy. The windings may be used to induce magnetic fields associated with a passage of current through coil 100. The windings are connected to a source of electricity (not shown). The potting or overmold may 110 be made of plastic, but other materials may be used. Coil 100 and overmold 110 are at least partially contained in a hollow housing 20. As shown in FIGS. 1 and 2, housing 20 can include a cover 50.

An armature 40 is selectively coupled to cover 50 as shown in FIG. 1. Armature 40 can selectively move in the axial direction (indicated by the arrow) from an engaged to a non-engaged position or anywhere between the engaged and non-engaged positions. In FIG. 1 armature 40 is shown in the engaged position. In another embodiment, armature 40 is selectively coupled to the housing 20 instead of the cover.

Portions of solenoid 10, for example, but not limited to, housing 20, armature 40, and/or cover 50 are constructed of a material designed to have residual magnetism after solenoid 10 has been energized and de-energized. The residual magnetism in the materials allows armature 40 to remain engaged without requiring continuous power to be supplied to solenoid 10.

Armature 40 can be in direct contact with cover 50 or housing 20 such that the solenoid 10 has a continuous magnetic circuit. When solenoid 10 is energized, the surfaces of armature 40, cover 50 and/or housing 20 mate and provide sufficient contact to allow any residual magnetism to create continuous path or circuit. As shown in FIG. 1, a minimal or partial gap is allowable as long as the magnetic flux traveling through magnetic circuit of housing 20, cover 50 and/or armature 40 is uninterrupted and strong enough to keep solenoid 10 latched. It is important to note that, if the system in which solenoid 10 is used has other forces working on armature 40, such as, but not limited to, the pull of a return spring (not shown), the residual magnetism in the magnetic circuit of solenoid 10 will have to be strong enough to overcome those opposing forces.

Armature 40, housing 20 and/or cover 50 are constructed of a ferromagnetic material, such as steel, so as to be able to be acted upon by the magnetic flux generated by the energized solenoid 10. Residual magnetism varies within the common steels available; however, by properly selecting the grade of steel, the holding force can be defined for a given solenoid design. One non-limiting example can be high carbon steels such as, but not limited to, 1065 steel. Other materials used, such as a ferrous material for armature 40, will be those known in the art.

Solenoid 10 is a part of system that includes a controller 12. The controller 12 is operatively connected to solenoid 10. The controller capable of adjusting the energizing current supplied to coil 100 to move armature 40 and/or sending a sensing pulse to solenoid 10. The controller 12 may also be configured to monitor or measure one or more aspects of solenoid 10. For example, the controller 12 can be configured to measure current rise, decay time or transition and/or resistance when a current-sensing pulse is applied to the coil. The current can be supplied by the controller 12 and/or a separate source.

If armature 40 is in a disengaged position, as shown in FIG. 2, and it is desired to move armature 40 to the engaged position, the controller 12 causes an electrical current to be supplied to coil 100. The electrical current in the coil windings create a magnetic flux. The magnetic flux permeates housing 20, armature 40, cover 50 and coil 100. Within a few milliseconds of coil 100 being energized, the magnetic flux moves armature 40 in the axial direction, as shown by the arrows in FIG. 1 and FIG. 2, and become engaged with cover 50, If housing 20 does not include a cover 50, then armature 40 moves in the axial direction to engage housing 20.

The electrical current can then be removed from coil 100 when armature 40 reaches an engaged position, as shown in FIG. 1. Armature 40 is maintained in the engaged position when the electrical current is removed because the magnetic flux has permeated housing 20, armature 40 and/or cover 50 creating a residual magnetism in one or more of housing 20, armature 40 and/or cover 50. The residual magnetism in one or more of these is strong enough to hold armature 40 in the engaged position.

To detect the position of armature 40, the controller 12 is capable of separately sending a resistance-sensing voltage purse into coil 100 to sense the coil temperature. The coil temperature can be sensed by virtue of the equation V=IR, where V=voltage, I=current and R=resistance. When a known current with a known voltage is provided, the resistance can be determined by the controller 12. The temperature of the coil is proportional to the resistance measured in the coil. Therefore, the measured resistance can be converted to determine the temperature.

The duration of the resistance-sensing voltage pulse must be as long as required to stabilize the current. This can vary depending on the inductance of the coil used, but is typically between 100 ms and 1 s. A sensing pulse of limited current is preferably used because the pulse does not change the magnetic flux and does not result in a change in the armature position or add an appreciable amount of heat to the system. The resistance-sensing voltage pulse can be generated from a variety of different mechanisms. One such mechanism is a current source which delivers 10% of maximum current capacity through coil 100 at the applied voltage. The voltage is then measured and the resistance of coil 100 calculated from the measured resistance.

In one preferred embodiment of the current invention, the controller 12 can send an inductance-sensing voltage pulse of shorter duration than the resistance-sensing voltage pulse to identify if armature 40 is engaged or disengaged based on how quickly the current rises in coil 100. The duration of the resistance-sensing voltage pulse is long enough to achieve steady state. The resistance-sensing voltage pulse can be managed by the controller 12 to use lower power and achieve steady state faster than is required to reach full current; one method would be to use PWM. The inductance-sensing voltage pulse is permitted to draw whatever current it can from its source.

Figure 3:
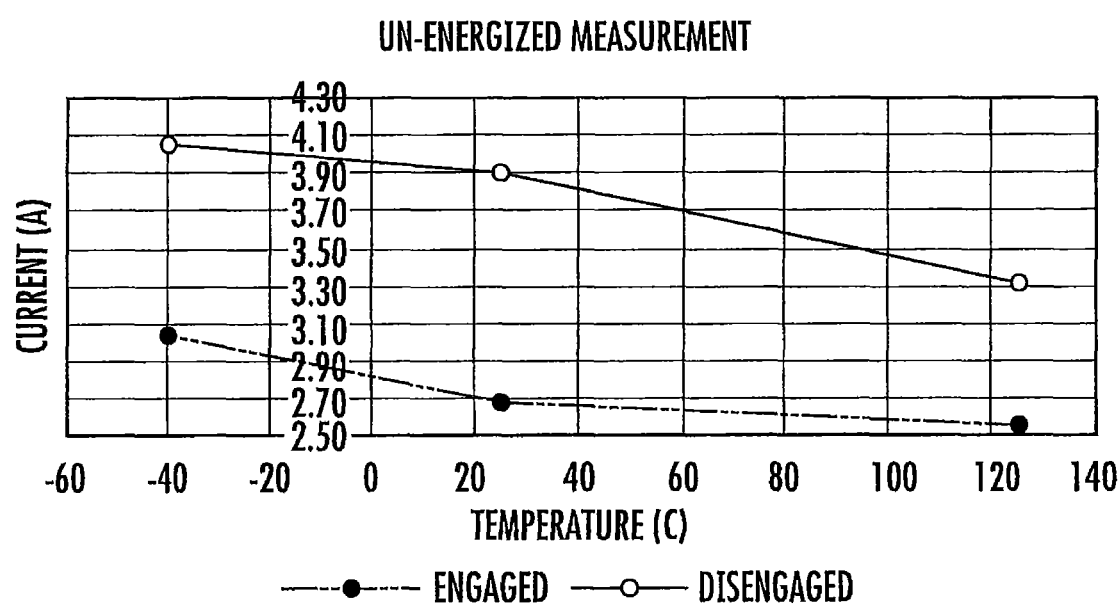
FIG. 3 is a graph showing measurement of current as a function of temperature in an un-energized solenoid.
Figure 4:
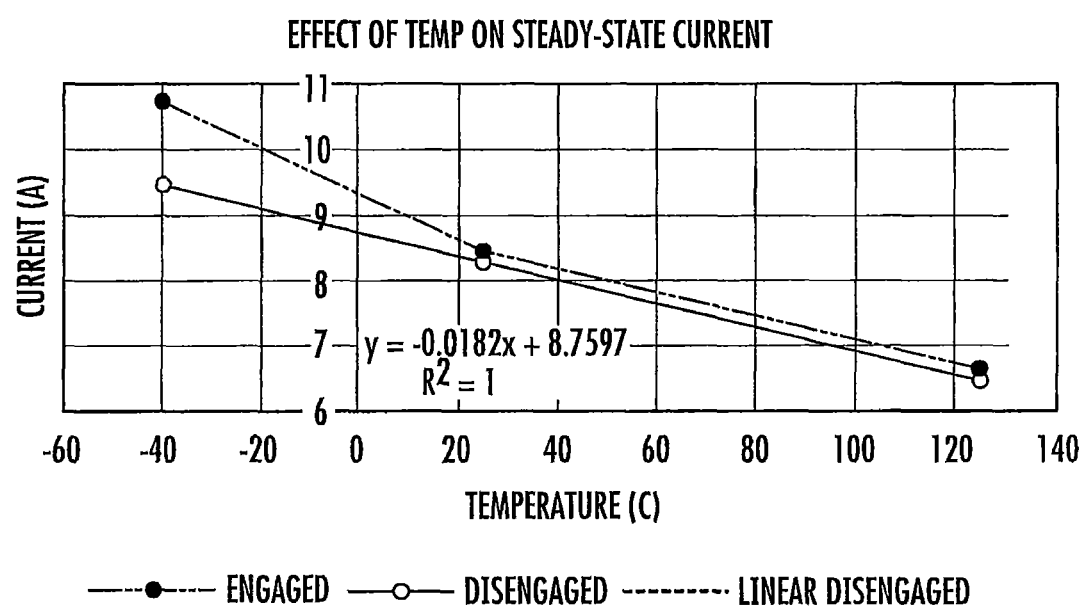
FIG. 4 is a graph showing the effect of temperature on steady-state current.

As can be appreciated from FIG. 3, the difference in the current measurement is significant between the engaged and disengaged solenoid and is temperature dependent. Therefore, it is beneficial to take the temperature of the coil into account when determining the position of armature 40. In the cases of an engaged and a disengaged solenoid, current decreases with an increase in temperature. As shown in FIG. 3, at low temperatures (left side of graph) the difference in current between armature 40 in an engaged position and armature 40 in a disengaged position is greater than the difference in current at high temperatures (right side of graph). The steady-state current over temperature is shown in FIG. 4.

As armature 40 moves to its engaged and disengaged positions the inductance of solenoid 10 changes. This change in inductance can be calculated from the measurement of current rise, decay or transition of the current across solenoid 10. The rise, decay, and/or transition of the current across coil 100 varies as a function of an inductance of solenoid 10. The inductance of solenoid 10, in turn, varies as a function of a position of armature 40 with respect to the solenoid. Accordingly, a position of armature 40 is determined based on measuring the response of solenoid 10 to an excitation pulse or sensing pulse. The expression of the current in solenoid 10 is calculated with the formula:

$$I_{(t)} = \frac{V}{R}\left(1 - e^{-\frac{R}{L}t}\right)$$

A change in the inductance (L) will result in a different current (I) over a fixed amount of time (t) at a fixed voltage (V). The resistance (R) can change significantly over temperature, but it can be factored out by measuring the steady-state resistance.

The current rise at various coil temperatures can be compared with predetermined or estimated current rise to determine position of the armature. For example, with reference to FIG. 3, if the temperature is low, a first range of currents can be expected. The first range of currents indicates armature 40 is in the engaged position. If the temperature is high, a second range of currents can be expected. The second range of currents indicates armature 40 is in the engaged position.

Similarly, if the temperature is low, a third range of currents can be expected. The third range of currents indicates armature 40 is in the disengaged position. If the temperature is high, a fourth range of currents can be expected. The fourth range of currents indicates armature 40 is in the disengaged position.

The controller 12 can be configured to compare the measured current rise, decay or transition of the current from the inductance-sensing voltage pulse to a pre-determined value to calculate the position of armature 40 relative to solenoid 10. The pre-determined value can be, but is not limited to, the current rise, decay or transition supplied to solenoid 10 when armature 40 is engaged at the determined temperature of coil 100 and/or the current rise, decay or transition supplied to solenoid 10 when armature 40 is disengaged.

In one embodiment, the controller 12 can send additional inductance-sensing voltage pulses to the system to continually monitor the position of armature 40.

The direction of the voltage pulse and the duration can be optimized to suit individual applications. In one preferred embodiment, armature 40 can be released or disengaged when desired by the controller 12 causing a current to be sent in the opposite direction than the initial current used to energize coil 100. This pulse should be of sufficient duration to generate enough flux to counteract the flux from the retained magnetism and short enough not to cause re-engagement. This type of operation will require a controller 12 that has the capability to drive current in both directions (H-bridge). Note that if the direction of the inductance-sensing voltage pulse is in the direction to release the solenoid, it may be necessary to follow the inductance-sensing voltage pulse with a quick re-energizing pulse to maintain the flux density in the metal and to keep the magnetic conditions consistent for sensing accuracy, Optimization due to material chosen and magnetic circuit part geometry can be achieved.

Additionally if the system in which solenoid 10 is used has other forces working on armature 40, such as, but not limited to, the pull of a return spring, the residual magnetism in the magnetic circuit of coil 100, housing 20 and/or cover 50 will have to be strong enough to overcome those opposing forces.

Solenoids used in automotive applications, such as differentials or power take off units, are within the scope of this invention. The system can be applied to devices including power take off units, differentials, axle connect/disconnect systems, and power transfer units. Because the solenoid in automotive applications will not be used in isolation, the inductance, and how it is measured or calculated, may change slightly what is described herein to account for the effect of nearby components (e.g. internal axle and the like) or other housings (e.g. carrier and the like). In addition, adjustments may need to be made to account for the effects of a motor vehicle's power system (battery/alternator). A drop in voltage during sensing due to an increased load may affect the measurement.

In accordance with the provisions of the patent statutes, the present invention has been described in what is considered to represent its preferred embodiments. However, it should be noted that the invention can be practiced otherwise than as specifically illustrated and described without departing from its spirit or scope.

What is claimed:

1. A method for sensing a position of an armature in a solenoid, said method comprising:
    providing a solenoid having a coil, a housing and an armature;
    applying a current to the coil to move the armature into a variety of positions including engaged and disengaged;
    terminating the current used to move the armature;
    applying a resistance-sensing voltage pulse to the coil, wherein the resistance-sensing voltage pulse is insufficient to move the armature;
    measuring the ohmic resistance from the resistance-sensing voltage pulse;
    determining the temperature of the coil from the measured ohmic resistance;
    applying an inductance-sensing voltage pulse to the coil, wherein the inductance-sensing voltage pulse is insufficient to move the armature;
    measuring the current rise or fall from the inductance-sensing voltage pulse; and
    comparing the measured current rise or fall to a pre-determined value, wherein the pre-determined value is either (i) a current rise or fall of the solenoid when the armature is in engagement at the determined temperature or (ii) a current rise or fall of the solenoid when the armature is in non-engagement with the solenoid at the determined temperature to determine the position of the armature relative to the solenoid.

2. The method of claim 1, further comprising applying a current to the coil in the opposite direction of the current used to move the armature to release the armature.

3. The method of claim 1, wherein the inductance-sensing voltage pulse is of a longer duration than the resistance-sensing voltage pulse.

4. The method of claim 1, wherein the duration of the resistance-sensing voltage pulse is about 10 ins to 1 s.

5. The method of claim 1, further comprising applying at least one additional inductance-sensing voltage pulse to the coil, wherein the additional inductance-sensing voltage pulse is insufficient to move the armature; measuring the current rise or fall from the additional inductance-sensing voltage pulse; and comparing the measured current rise or fall to a pre-determined value, wherein the pre-determined value is either (i) a current rise or fall of the solenoid when the armature is in engagement, at the determined temperature and/or (ii) a current rise or fall of the solenoid when the armature is in non-engagement with the solenoid at the determined temperature to determine the position of the armature relative to the solenoid.

6. A system for determining a position of an armature in a solenoid, the system comprising:
    a solenoid including a coil, an armature and a housing, wherein the coil is at least partially enclosed in the housing and the armature is selectively in a coupled or uncoupled position relative to the housing;
    a controller in communication with the solenoid to provide the coil with magnetization current and to detect current, rise time and ohmic resistance in the coil; and
    wherein the armature and housing are constructed of ferromagnetic material capable of holding a residual magnetic force.

7. The system of claim 6, wherein the housing includes a cover.

8. The system of claim 6, wherein the ferromagnetic material is a high carbon steel.

9. The system of claim 6, wherein the controller is capable of changing the polarity of the magnetization current supplied to the coil from one direction to the opposite direction.

10. The system of claim 6, wherein the solenoid is a latching solenoid.

11. The method of claim 1, wherein at least a portion of the solenoid has residual magnetism to allow the armature to remain in an engaged position without requiring continuous power to be supplied to the solenoid.

12. The system of claim 6, wherein at least a portion of the solenoid has residual magnetism to allow the armature to remain in an engaged position without requiring continuous power to be supplied to the solenoid.

\* \* \* \* \*